(12) United States Patent
Lalo et al.

(10) Patent No.: US 10,592,795 B2
(45) Date of Patent: Mar. 17, 2020

(54) PACKAGED ELECTRONIC MODULE AND MANUFACTURING METHOD THEREOF

(71) Applicants: Cyril Lalo, Los Angeles, CA (US); Sebastien Pochic, Schaerbeek (BE); Jacques Essebag, Paris (FR)

(72) Inventors: Cyril Lalo, Los Angeles, CA (US); Sebastien Pochic, Schaerbeek (BE); Jacques Essebag, Paris (FR)

( * ) Notice: Subject to any disclaimer, the term of this patent is extended or adjusted under 35 U.S.C. 154(b) by 0 days.

(21) Appl. No.: 16/299,037

(22) Filed: Mar. 11, 2019

(65) Prior Publication Data

US 2019/0205718 A1   Jul. 4, 2019

Related U.S. Application Data

(63) Continuation-in-part of application No. 15/645,234, filed on Jul. 10, 2017, now Pat. No. 10,268,942.

(51) Int. Cl.
| | |
|---|---|
| *G06K 19/077* | (2006.01) |
| *H01L 23/498* | (2006.01) |
| *H01L 23/66* | (2006.01) |
| *H05K 1/18* | (2006.01) |
| *H01L 23/14* | (2006.01) |

(52) U.S. Cl.
CPC ... *G06K 19/07747* (2013.01); *G06K 19/0775* (2013.01); *G06K 19/07707* (2013.01); *H01L 23/49855* (2013.01); *H01L 23/66* (2013.01); *H05K 1/189* (2013.01); *H01L 23/145* (2013.01); *H01L 2223/6677* (2013.01)

(58) Field of Classification Search
None
See application file for complete search history.

(56) References Cited

U.S. PATENT DOCUMENTS

| | | | |
|---|---|---|---|
| 10,268,942 B2 * | 4/2019 | Lalo | G06K 19/07722 |
| 2017/0132507 A1 * | 5/2017 | Blythe | G06K 19/07745 |

* cited by examiner

*Primary Examiner* — Kristy A Haupt
(74) *Attorney, Agent, or Firm* — Cohen IP Law Group, P.C.; Michael N. Cohen

(57) ABSTRACT

The present invention is a packaged electronic module with embedded electronics for use in smart cards. This invention assembles a plurality of electronics components on a flexible printed circuit, together with an integrated circuit chip and a contact plate, into a module. This module can then be embedded into a plastic card, using regular milling techniques, by a card manufacturer. This method packages the plurality of electronics components into a module. The present invention provides a business with the capability to avoid additional capital expenditure required for special equipment and enables all existing card manufacturers to manufacture smart cards with embedded electronics.

17 Claims, 16 Drawing Sheets

PACKAGED ELECTRONIC MODULE AND MANUFACTURING METHOD THEREOF

CROSS REFERENCE TO RELATED APPLICATIONS

This application is a continuation in part of U.S. patent application Ser. No. 15/645,234, filed Jul. 10, 2017, the entire contents of which are hereby fully incorporated herein by reference for all purposes.

FIELD OF THE INVENTION

This invention relates to electronic modules, and more particularly to a packaged electronic module with embedded electronics for use in smart cards.

BACKGROUND OF THE INVENTION

Semiconductor technology has made tremendous progress in the last few decades. Contactless smart cards are currently used widely in many fields like transport sector and banking sector for identifying persons as well as objects. Smart Cards, also known as chip cards and IC cards, are plastic that contain one or more semiconductor chips. In most of the applications, the smart cards are contactless which means that the cards perform data transfer using radio frequency (RF) technology between the card and a receiver/transmitter. Additionally, dual interface cards can have both capabilities using a single chip module. In general, many different fields of application arise for smart cards or integrated circuit cards, for example in the field of personal identification (identity cards, access cards, authorization cards), in the field of data encryption (code cards), for personal use (bank smart cards, payment cards) and in similar fields.

Along with the progress of electronic industries, electronic products are developed toward the trend of miniaturization and multi-function. Accordingly, various package types have been developed. Electronic packaging refers to the packaging of the integrated circuit chips or dies. The materials play an important role in electronic packaging, most of the work on electronic packaging is concerned with packaging scheme rather than materials. The conventional approach to electronic packaging and interconnect has been to package individual integrated circuit (IC) chips into a single package and to attach these packages to a printed circuit board to provide interconnect between the individual IC chips.

Another approach describes a double-sided electronic module of a hybrid contact-contactless smart card designed to be lodged in a cavity of the card, where the cards are incorporated in a blank with a special manufacturing format. Said device comprises a unit for depositing and pre-gluing a protective layer on at least one blank, a laminating unit comprising means for pressing, heating and cooling at least one blank and a unit for cutting the blank into a smart card. The pressing, heating and cooling means comprise two supports placed opposite each other and displaceable towards each other in order to apply pressure on the said blank. Each support comprises at least one ceramic heating and cooling device comprising a stack made up of a ceramic block and a metal laminating plate. However, this method has high chance of damaging the components since there is hot or cold lamination step included. Moreover, additional capital expenditure and special equipment are required for laminating.

Another approach describes an integrated circuit (IC) film with a conventional packaging step, and, in particular, it need not be covered with any package molding material. The IC chip is directly mounted on a flexible printed circuit (FPC) board. The IC chip is disposed on the FPC board, and is bonded to leads of the FPC board and thus electrically connected thereto. Also, a flexible plastic substrate is needed to mount the components into the FPC, thus increases the cost of the FPC. Moreover, additional operations such as pre-lamination and lamination operations are required before the IC chip is embedded.

Yet another approach describes a method for producing a smart card module, the arrangement includes arranging a smart card module on a first carrier layer, wherein the first carrier layer is free of a prefabricated smart card module receptacle cutout for receiving the smart card module, wherein the first carrier layer may include plastic (a polymer). The smart card module includes a substrate, a chip on the substrate, a first mechanical reinforcement structure between the chip and the substrate. The smart card module can be embedded between the first carrier layer and the second carrier layer. The embedding of the smart card module can be carried out, for example, by means of lamination, e.g. by means of cold lamination or hot lamination, or by means of lamination and additional pressing. Additionally, the embedding of the smart card module can be carried out by means of pressing. The substrate (or the carrier) for providing a smart card module can be formed from a flexible material, e.g. a plastic or polymer, and/or have a corresponding thickness, with the result that the substrate is flexible. However, this method does not include embedded electronics. Also, this method of manufacturing cards by laminating is hard to do and only a limited number of card manufacturers are capable of doing it correctly.

Therefore, there is a need for an efficient electronic packaging module and a manufacturing method thereof. This method would assemble all the required electronics into a module instead of onto a Flexible Printed Circuit (FPC). The cost of the module would be lower than that of an FPC. Such a method would not need a flexible plastic substrate to mount the components. Further, it would not include any lamination step, thus reducing the risk of damaging the components. Thus, it would provide a business with the capability to avoid additional capital expenditure required for special equipment. Such a needed method would decrease the unit cost of a packaging chip. This embodiment would enable all existing card manufacturers to manufacture smart cards with embedded electronics. The present embodiment overcomes shortcomings in this area by accomplishing these critical objectives.

SUMMARY OF THE DISCLOSURE

To minimize the limitations found in the prior art, and to minimize other limitations that will be apparent upon the reading of the specification, the present invention is a packaged electronic module with embedded electronics for use in smart cards. This invention is a new type of packaged electronic module that is used to manufacture value-add smart cards with embedded electronics. The present packaged electronic module packages all the electronics components usually found on a flexible printed circuit (FPC), together with an integrated circuit chip and a contact plate, into a module. This module can then be embedded into a plastic card, using regular milling techniques, by a card manufacturer.

The present invention provides an efficient electronic packaging module and a manufacturing method thereof. This method assembles all required electronics components into a module instead of onto a flexible printed circuit (FPC). The present invention provides a business with the capability to avoid additional capital expenditure required for special equipment. Also, the present invention decreases the unit cost of a packaging chip and enables all existing card manufacturers to manufacture smart cards with embedded electronics.

Other features and advantages of the present invention will become apparent from the following more detailed description, taken in conjunction with the accompanying drawings, which illustrate, by way of example, the principles of the invention.

BRIEF DESCRIPTION OF THE DRAWINGS

Elements in the figures have not necessarily been drawn to scale in order to enhance their clarity and improve understanding of these various elements and embodiments of the invention. Furthermore, elements that are known to be common and well understood to those in the industry are not depicted in order to provide a clear view of the various embodiments of the invention, thus the drawings are generalized in form in the interest of clarity and conciseness.

DETAILED DESCRIPTIONS OF PREFERRED EMBODIMENTS

In the following discussion that addresses a number of embodiments and applications of the present invention, reference is made to the accompanying drawings that form a part hereof, and in which is shown by way of illustrating specific embodiments in which the invention may be practiced. It is to be understood that other embodiments may be utilized and changes may be made without departing from the scope of the present invention.

Various inventive features are described below that can each be used independently of one another or in combination with other features. However, any single inventive feature may not address any of the problems discussed above or only address one of the problems discussed above. Further, one or more of the problems discussed above may not be fully addressed by any of the features described below. The invention will now be described with reference to the accompanying drawing which does not limit the scope and the ambit of the invention. In the following discussion that addresses a number of embodiments and applications of the present invention, reference is made to the accompanying drawings that form a part hereof, and in which is shown by way of illustrating specific embodiments in which the invention may be practiced. It is to be understood that other embodiments may be utilized and changes may be made without departing from the scope of the present invention.

The term "mechanism," as used herein, refers to any device(s), process(es), service(s), or combination thereof. A mechanism may be implemented in hardware, software, firmware, using a special-purpose device, or any combination thereof. A mechanism may be mechanical or electrical or a combination thereof. A mechanism may be integrated into a single device or it may be distributed over multiple devices. The various components of a mechanism may be co-located or distributed. The mechanism may be formed from other mechanisms. In general, as used herein, the term "mechanism" may thus be considered shorthand for the term device(s) and/or process(es) and/or service(s).

Referring now to FIGS. 1-15, the invention according to exemplary embodiments hereof will be described in further detail.

Figure 1:
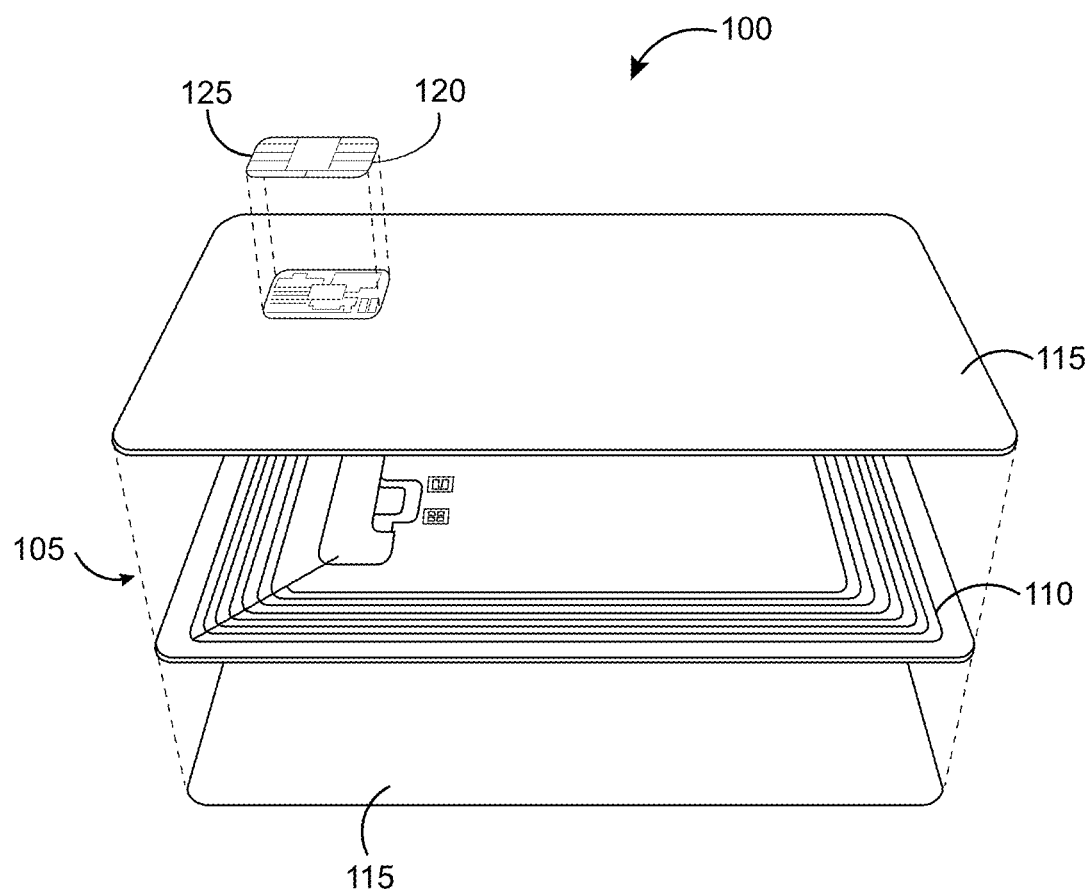
FIG. 1 represents an exploded perspective view of a smart card in accordance with the preferred embodiment of the present invention.

FIG. 1 depicts a general and exploded perspective view of a value-add smart card 100 in accordance with an exemplary embodiment of the present invention is illustrated. A value-add smart card 100 comprises a card body 105, a plurality of plastic card layers 115 and a packaged electronic module 120 including and/or coupled to a contact plate 125. The card 100 may also comprise a card antenna 110, or an embedded battery (not shown).

According to exemplary embodiments hereof, the packaged electronic module 120 may generally include a contact plate 142, one or more electronic readouts 138, one or more integrated circuit (IC) chips 144, a plurality of electronic components 146, and any other components or elements that may be necessary for the packaged electronic module 120 to perform its functionalities. This is shown in FIGS. 2, 3, 4, 5, 6, 7A-7C, 9A-9C, 11A-11C and 13A-13C, 14 and 15A-15C with reference to packaged electronic modules that may correspond to the packaged electronic module 120 of FIG. 1. In this way, the packaged electronic module may be a self-contained unit that may include all of the essential components that it may require to perform its functionalities. Because of this, the packaged electronic module 120 may also be referred to as an all-in-one assembly.

The contact plate 142 may allow the module 120 to make electrical contact with card readers as necessary. The electronic readout 138 may provide real-time information such as the current balance available on the card or in an associated bank account, the number of trips available (e.g. on transit cards), dynamic security codes to effectively tokenize CVx2 data to prevent fraud, and other information.

The packaged electronic module 120 may be embedded in the card body 105. Note that the smart card 100 and the packaged electronic module 120 of FIG. 1 are meant for demonstrational and conceptual purposes and that a person of ordinary skill in the art will understand that the packaged electronic module 120 may be configured with the smart card 100 in any way that may allow for the packaged electronic module 120 to perform its functionalities. In addition, while FIG. 1 shows the module 120 generally configured on the top surface of the smart card 100, the module 120, or portions thereof, may be configured on any one or more surfaces of the card, and/or in any one or more intermediary layers of the card, and/or in any combination of surfaces of the card and/or layers of the card. This will be described in later sections.

The card body 105 may be plain, having different layers of plastic or other materials, of which one or more of the layers may include an antenna (e.g. to be used for contactless card functionalities such as RFID communications) or an embedded battery (not shown), etc. To support cards 100 that may include one or more antennas 110, the packaged electronic module 120 may be connected to the antenna 110 using connectors, a micro-antenna or other connection mechanisms. In all of the embodiments described herein, it may be preferable that the embedding of the module 120 not interfere or otherwise obstruct any of the other components and elements of the card 100 such as the internal antenna 110.

The packaged electronic module 120 may be used in the manufacturing and/or fabrication and/or assembly processes of value-add smart cards 100 with embedded electronics. The value-add smart card 100 may be contactless-only, contact-only, or may be dual-interface (contact and contactless). According to exemplary embodiments hereof, the components that may typically be found on a Flexible Printed Circuit (FPC) that may be configured with the smart card 100, may be combined together to form the all-in-one module 120. This module 120 may then be embedded into a plastic card by a card manufacturer, using regular milling techniques or other manufacturing methods. Depending on the relative size of the electronic components and the contact plate, different assemblies are possible. This invention has less risk of damaging the electronic components since there is no hot or cold lamination involved. This invention enables all existing card manufacturers to manufacture these value-add smart cards with embedded electronics.

In some exemplary embodiments hereof, the visible components of the module 120 may be located and/or visible on opposite sides of the smart card 100. For example, the contact plate 142 may be located on the top surface of the card 100, and the electronic readout 138 may be located and/or visible on the bottom surface of the card 100, or vice versa. In addition, in some exemplary embodiments hereof, the visible components of the module 120 may be located and/or visible on the same side of the smart card 100. For example, both the contact plate 142 and the electronic readout 138 may be located and/or visible on the top surface of the card 100.

Visible Components on Opposite Sides of the Card

Figure 2:
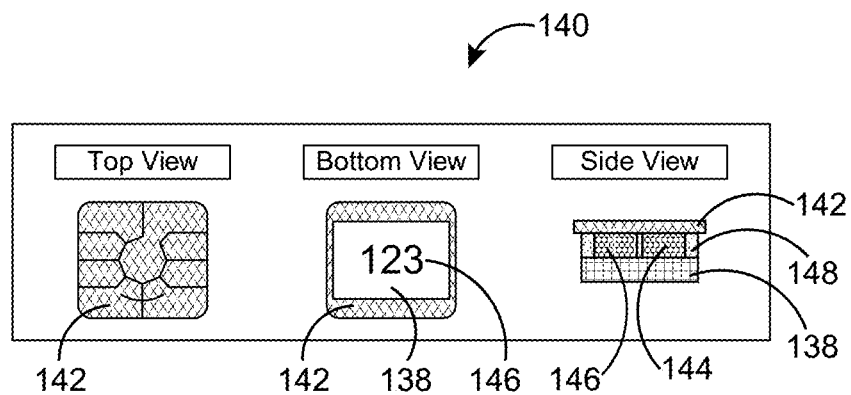
FIG. 2 represents a first assembly of a packaged electronic module in accordance with the preferred embodiment of the present invention.

FIG. 2 illustrates a first assembly of the packaged electronic module 140 (that may correspond to the packaged electronic module 120 in FIG. 1) in accordance with a preferred embodiment of the present invention. The first assembly 140 comprises an all-in-one assembly where the footprint of the electronics components (e.g., the electronic readout) is not larger than that of a contact plate 142. The first assembly of the packaged electronic module 140 comprises the contact plate 142 connected to an integrated circuit chip 144, a plurality of electronic components 146 connected to the contact plate 142 and the integrated circuit chip 144, an electronic display 138 connected to the plurality of electronic components 146 and a plurality of connectors (not shown) that may connect the packaged electronic module 140 to the card antenna 110 (shown in FIG. 1) or an embedded battery (not shown). The thickness of the packaged electronic module 140 may be equal to or smaller than, but preferably not larger than, that of the plastic card. The packaged electronic module 140 may include a micro-antenna to connect to an antenna in the card using inductive coupling. Note also that a value-add component, such as a fingerprint sensor, LEDs, and/or an electronic or mechanical button may also be included in addition to or instead of the electronic display 138.

Figure 2A:
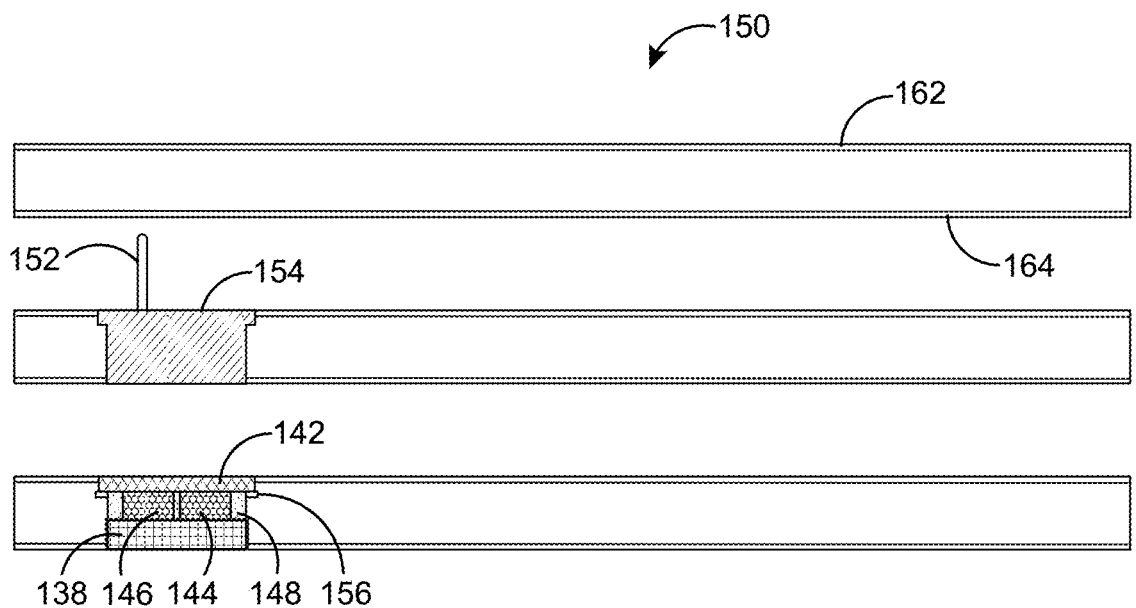
FIGS. 2A-2B are schematic diagrams showing an embedding of the first assembly shown in FIG. 2 in accordance with the preferred embodiment of the present invention.
Figure 2B:
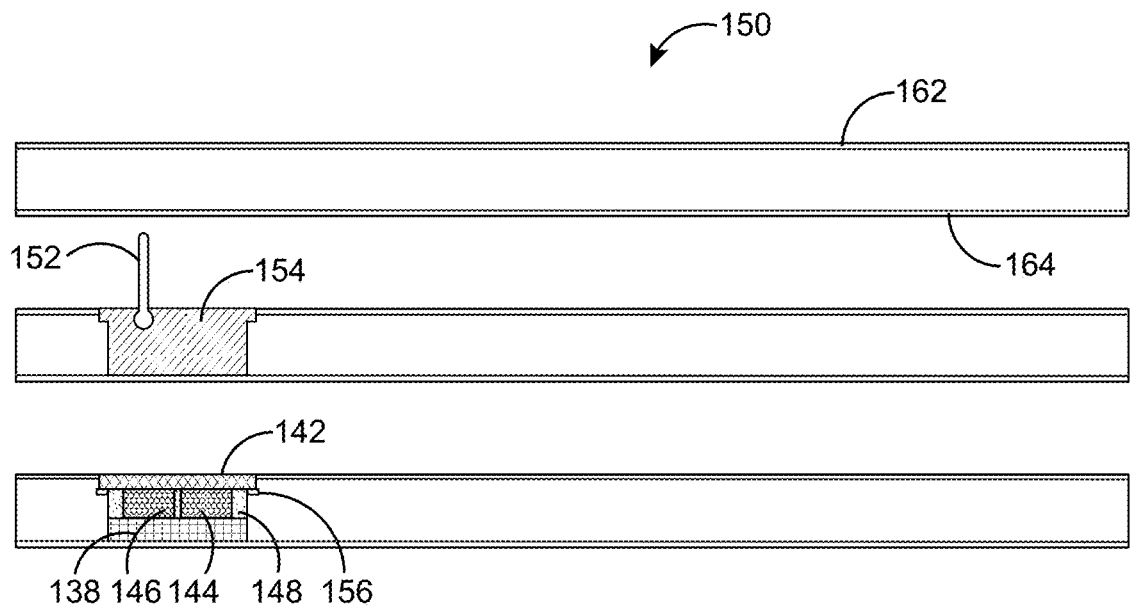

FIGS. 2A-2B are schematic diagrams showing an embedding of the first assembly shown in FIG. 2 according to the present invention. A method of fabrication of a value-add smart card 100 (shown in FIG. 1) comprising the step of embedding the all-in-one assembly of the first assembly 140, by milling a card 150 from the front of the card all the way through the back of the card and embedding the packaged electronic module 140 from the front of the card. The method of fabrication of a value-add smart card 100 (shown in FIG. 1) further comprising the step of milling a card 150 from the front of the card to the back protective overlay 164, but leaving the protective overlay 164 intact, which should be transparent if for example 138 is an electronic display, and embedding the packaged electronic module 140 from the front of the card. In this case the thickness of the packaged electronic module 140 will be equal to that of the card minus the thickness of that back protective layer. The milled area 154 should conform to the shape of the packaged electronic module 140.

Figure 3:
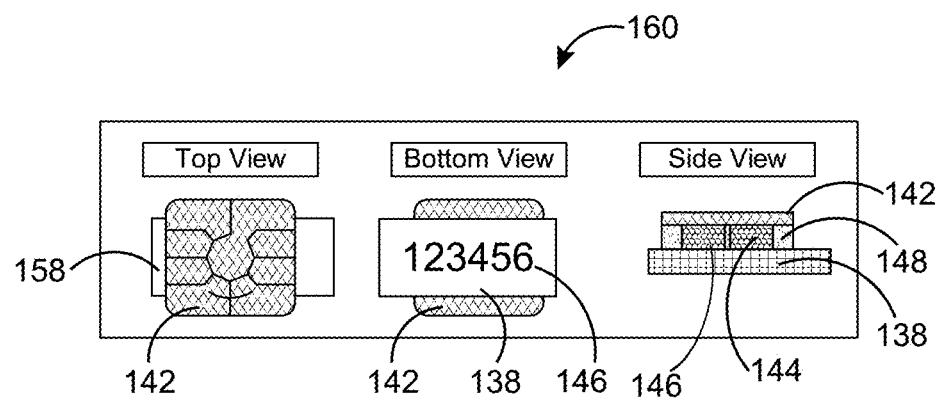
FIG. 3 represents a second assembly of a packaged electronic module in accordance with the preferred embodiment of the present invention.

FIG. 3 represents the second assembly of the packaged electronic module in accordance with the preferred embodiment of the present invention. The second assembly 160 (that may correspond to the packaged electronic module 120 in FIG. 1) comprises an all-in-one assembly where the footprint of the electronics 158 is larger than that of the contact plate 142. The second assembly of a packaged electronic module 160 comprises the contact plate 142 connected to the integrated circuit chip 144, the plurality of electronic components 146 connected to the contact plate 142 and the integrated circuit chip 144, an electronic display 138 connected to the plurality of electronic components 146 and the plurality of connectors (not shown) that may connect the packaged electronic module 160 to the card antenna 110 (shown in FIG. 1) or an embedded battery (not shown). The thickness of the packaged electronic module 160 is equal or smaller to that of the smart card. Depending on the size of the electronic components 146, the module could have an asymmetric shape to avoid that some electronic components would be too close to the card's border. The packaged electronic module 160 may have a micro-antenna to connect to an antenna in the card using inductive coupling. Note also that a value-add component, such as a fingerprint sensor, LEDs, and/or an electronic or mechanical button may also be included in addition to or instead of the electronic display 138.

Figure 3A:
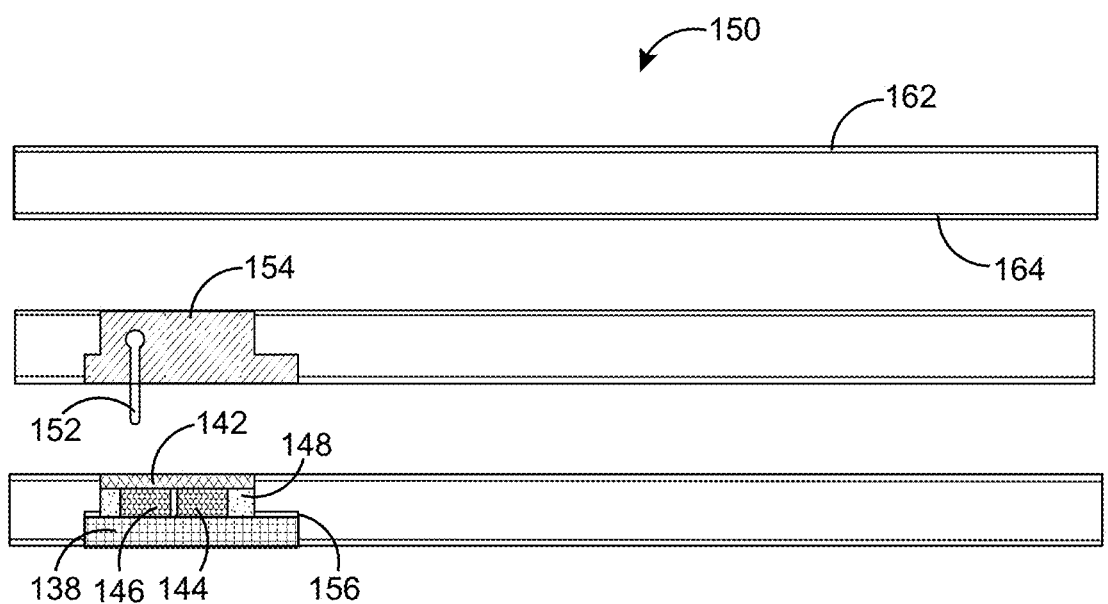
FIG. 3A is a schematic diagram showing an embedding of the second assembly shown in FIG. 3 according to the present invention.

FIG. 3A is a schematic diagram showing an embedding of the second assembly shown in FIG. 3 according to the present invention. The method of fabrication of a value-add smart card 100 (shown in FIG. 1) comprising the step of embedding the all-in-one assembly of a second assembly 160, by milling the smart card 150 from the back of the card all the way through the front of the card and embedding the module from the back of the card since the back of the second assembly 160 is larger than the front. The milled area 154 is larger on the back of the card than the front the card to conform to the shape of the packaged electronic module 160.

Figure 4:
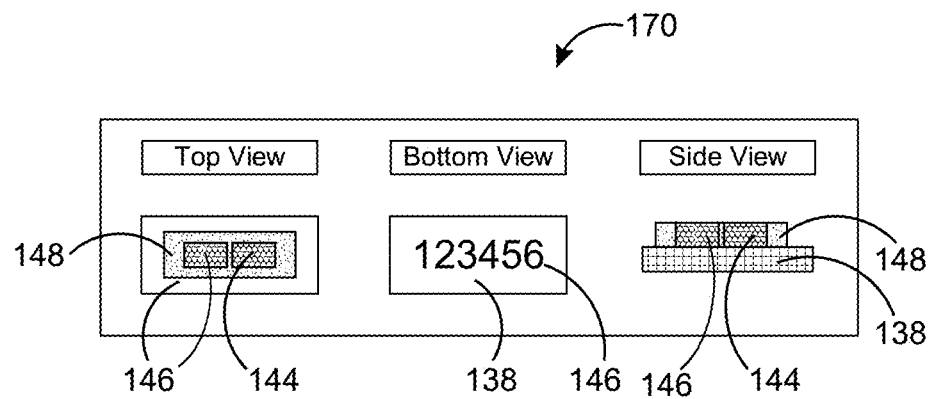
FIG. 4 represents a third assembly of a packaged electronic module in accordance with the preferred embodiment of the present invention.

FIG. 4 represents a third assembly of the packaged electronic module in accordance with the preferred embodiment of the present invention. The third assembly of the packaged electronic module 170 (that may correspond to the packaged electronic module 120 in FIG. 1) comprises the integrated circuit chip 144, the plurality of electronic components 146, the electronic display 138 connected to the plurality of electronic components 146 and the plurality of connectors (not shown) that may connect the packaged electronic module 170 to the card antenna 110 (shown in FIG. 1) or an embedded battery (not shown). The thickness of packaged electronic module 170 is not larger than that of the plastic card. Depending on the size of the electronic components 146, the module could have an asymmetric shape to avoid that some electronic components would be too close to the card's border. The third assembly does not have a contact plate so it can be used for contactless-only cards, one-time-password cards, or other value-add cards that do not require a contact plate to function. The packaged electronic module may have a micro-antenna to connect to an antenna in the card using inductive coupling. Note also that a value-add component, such as a fingerprint sensor, LEDs, and/or an electronic or mechanical button may also be included in addition to or instead of the electronic display 138.

Figure 4A:
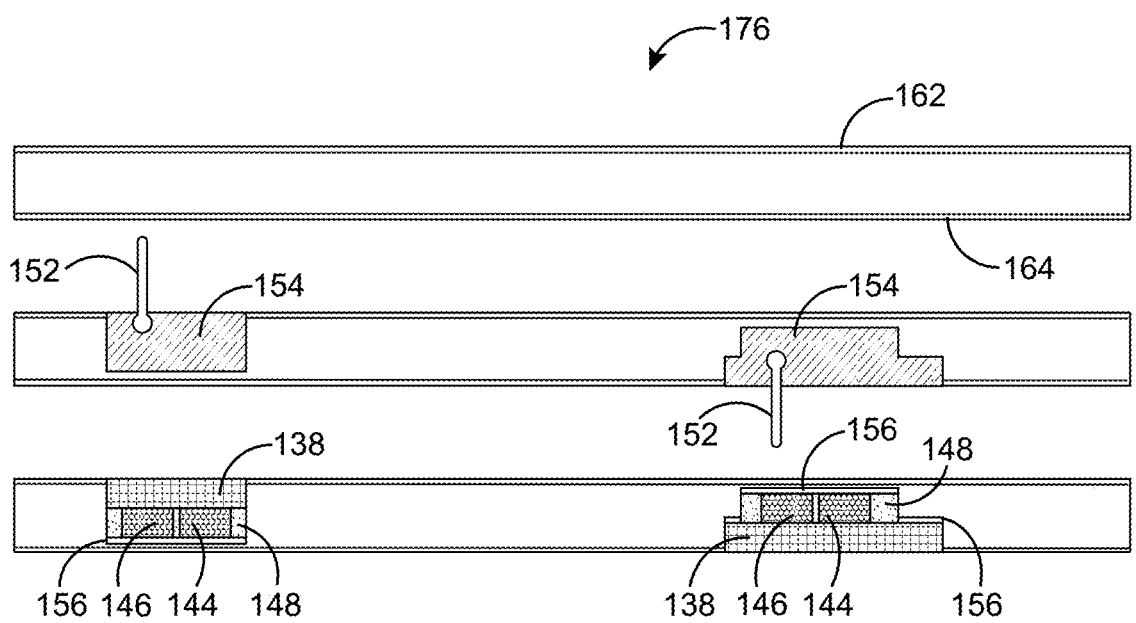
FIG. 4A is a schematic diagram showing an embedding of the third assembly shown in FIG. 4 according to the present invention.

FIG. 4A is a schematic diagram showing an embedding of the third assembly shown in FIG. 4, according to the present invention. The method of fabrication of a value-add smart card 100 (shown in FIG. 1) comprising the step of embedding the third assembly of the packaged electronic module 170, by milling a card 176 either from the back or the front of the card, and embedding the packaged electronic module 170. Since the packaged electronic module 170 does not have the contact plate 142, it can virtually be embedded anywhere on the card. The milled area 154 should conform to the shape of the packaged electronic module 170. Note that while FIG. 4A may depict a card 176 milled from the top of the card 176 to embed a module 170 from the top, and from the bottom to embed a module 170 from the bottom, this is shown for demonstration and conceptual purposes, and the card 176 may include only a top embedded module 170, only a bottom embedded module 170, or any combination thereof.

Figure 5:
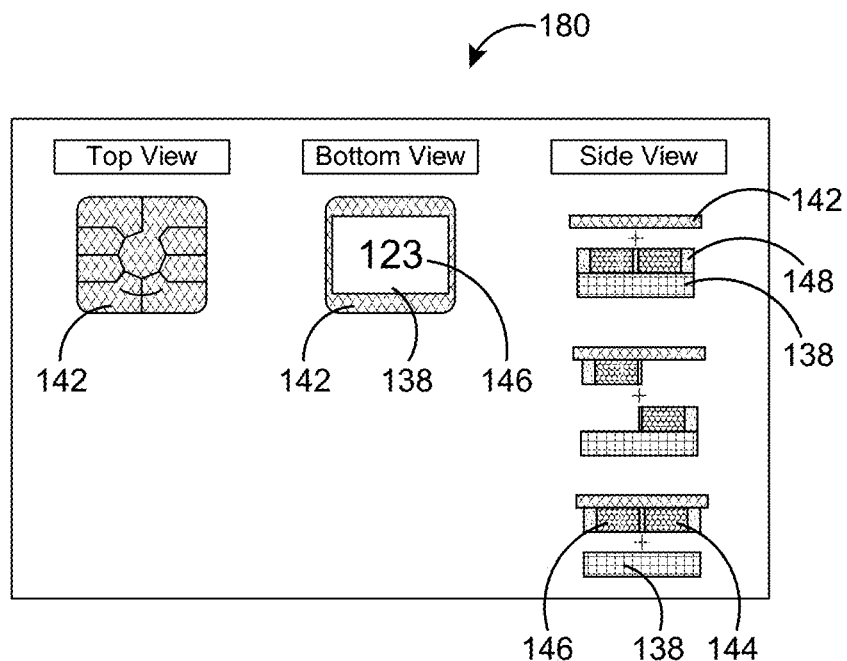
FIG. 5 represents a fourth assembly of a packaged electronic module in accordance with the preferred embodiment of the present invention.

FIG. 5 represents a fourth assembly of a packaged electronic module in accordance with the preferred embodiment of the present invention. The fourth assembly 180 (that may correspond to the packaged electronic module 120 in FIG. 1) comprises a two-part assembly where the footprint of all the electronics is not larger than that of the contact plate 142. The fourth assembly of the packaged electronic module 180 comprises the plurality of electronic components 146 connected to the contact plate 142 and the integrated circuit chip 144, the electronic display 138 connected to the plurality of electronic components 146 and the plurality of connectors (not shown) that may connect the packaged electronic module 180 to the card antenna 110 (shown in FIG. 1) or an embedded battery (not shown). The thickness of the packaged electronic module 180 may be less than, equal to but preferably not larger than that of the plastic card. The fourth assembly 180 may be further defined as an assembly of the top half portion and the bottom half portion of the packaged electronic module. The fourth assembly 180 wherein the top half portion and the bottom half portion is assembled into an asymmetric packaged electronic module. The packaged electronic module 180 may have a micro-antenna to connect to an antenna in the card using inductive coupling. Note also that a value-add component, such as a fingerprint sensor, LEDs, and/or an electronic or mechanical button may also be included in addition to or instead of the electronic display 138.

Figure 5A:
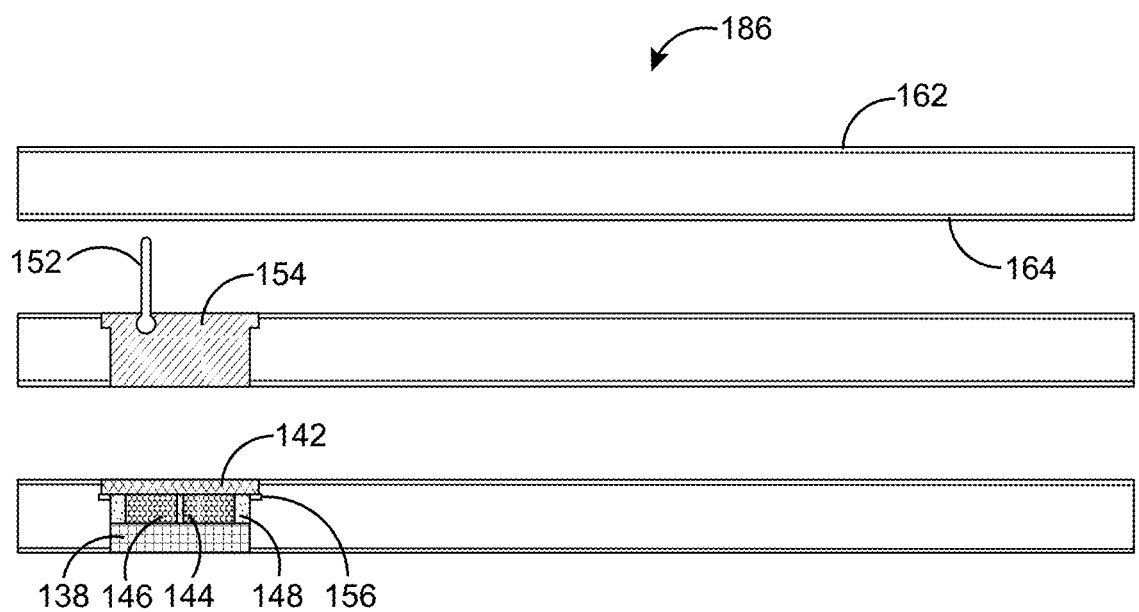
FIG. 5A is a schematic diagram showing an embedding of the fourth assembly shown in FIG. 5 according to the present invention.

FIG. 5A is a schematic diagram showing an embedding of the fourth assembly shown in FIG. 5 according to the present invention. The method of fabrication of a value-add smart card 100 (shown in FIG. 1) comprising the step of embedding the fourth assembly 180, by milling the card from the front and embedding the top half portion of the module from the front of the card, the bottom half portion from the back of the card and connecting both halves to assemble a full module. The milled area 154 should conform to the shape of the packaged electronic module 180.

Figure 6:
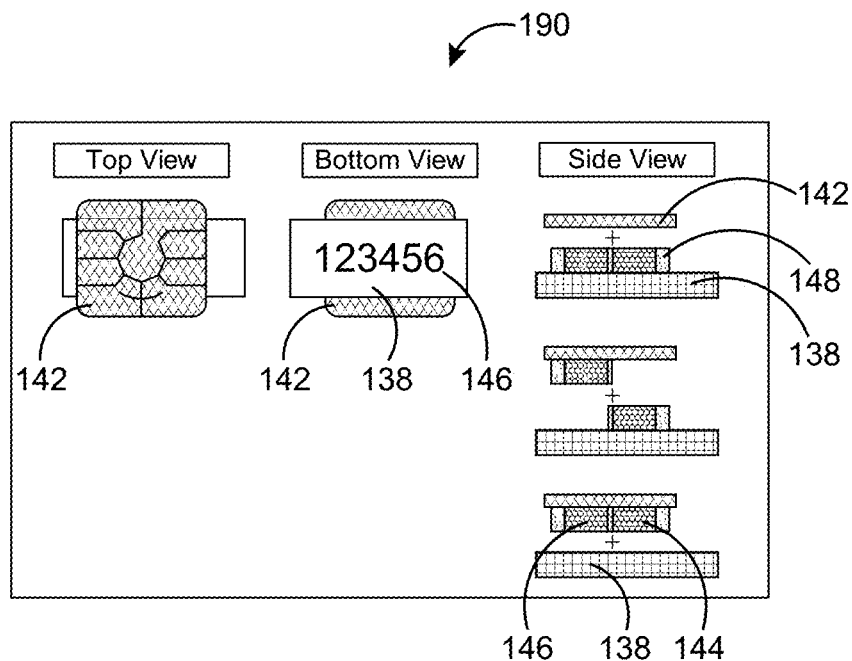
FIG. 6 represents a fifth assembly of a packaged electronic module in accordance with the preferred embodiment of the present invention.

FIG. 6 represents a fifth assembly of a packaged electronic module in accordance with the preferred embodiment of the present invention. The fifth assembly 190 (that may correspond to the packaged electronic module 120 in FIG. 1) comprises a two-part assembly where the footprint of the all electronics is larger than that of the contact plate 142. The fifth assembly of a packaged electronic module 190 comprises the plurality of electronic component 146 connected to the contact plate 142 and the integrated circuit chip 144, the electronic display 138 connected to the plurality of electronic components 146 and the plurality of connectors (not shown) that may connect the packaged electronic module 190 to the card antenna 110 (shown in FIG. 1) or an embedded battery (not shown). The thickness of the packaged electronic module 190 may be less than, equal to but preferably not larger than that of the plastic card. The fifth assembly 190 may be further defined as an assembly of the top half portion and the bottom half portion of the packaged electronic module. The fifth assembly 190 wherein the bottom half portion is larger than the top half portion of the packaged electronic module, wherein the top half portion and the bottom half portion is assembled into an asymmetric packaged electronic module to avoid that some electronic components 146 would be too close to the card's border. The packaged electronic module 190 may have a micro-antenna to connect to an antenna in the card using inductive coupling. Note also that a value-add component, such as a fingerprint sensor, LEDs, and/or an electronic or mechanical button may also be included in addition to or instead of the electronic display 138.

Figure 6A:
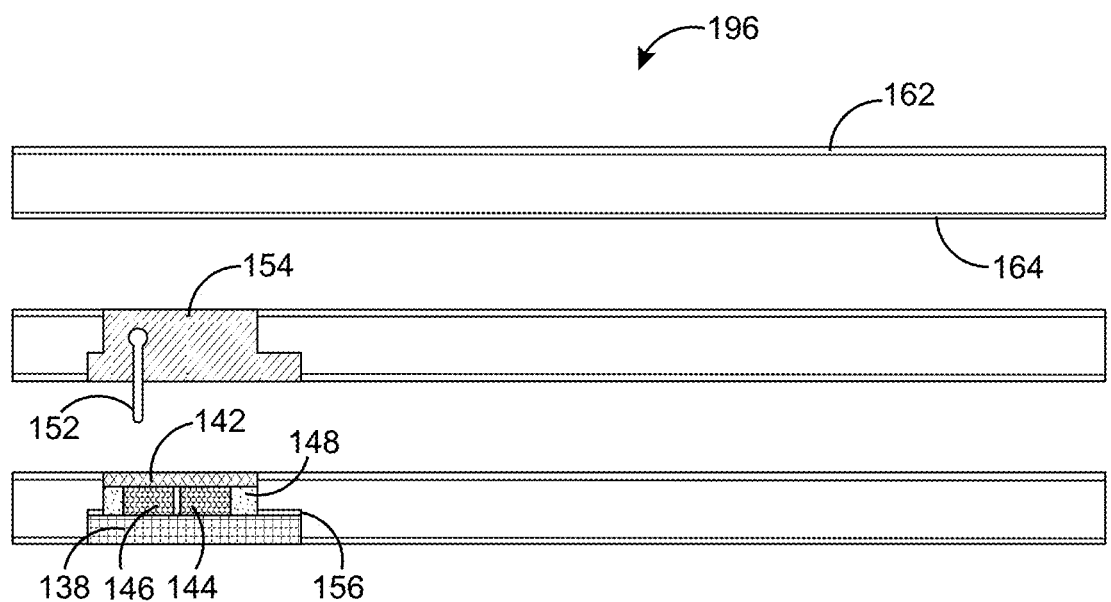
FIG. 6A is a schematic diagram showing an embedding of the fifth assembly shown in FIG. 6 according to the present invention.

FIG. 6A is a schematic diagram showing an embedding of the fifth assembly shown in FIG. 6 according to the present invention. The method of fabrication of a value-add smart card 100 (shown in FIG. 1) comprising the step of embedding the fifth assembly 190, by milling the card from the back of the card all the way through the front of the card and embedding the top half portion of the module from the front of the card, the bottom half portion from the back of the card and connecting both halves to assemble a full module. The milled area 154 should conform to the shape of the packaged electronic module 190.

Visible Components on the Same Side of the Card

In some exemplary embodiments hereof, the visible components of the packaged electronic module 120 may be located and/or visible on the same side of the smart card 100. For example, portions of the contact plate 142 and/or portions of the electronic readout 138 may both be located and/or visible on the top surface of the card 100, on the bottom surface of the card 100, on any other surface of the card 100 and any combination thereof.

Figure 7A:
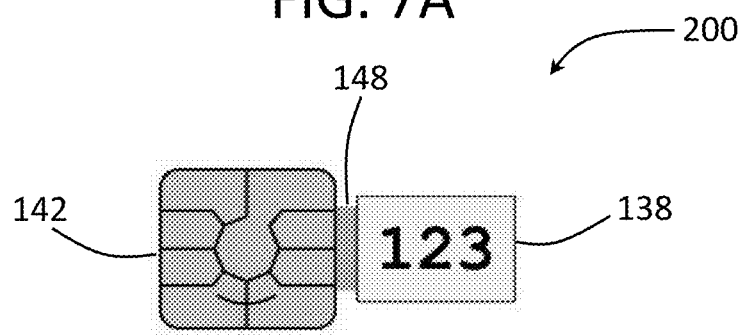
FIGS. 7A-7C show aspects of a packaged electronic module according to exemplary embodiments hereof.
Figure 7B:
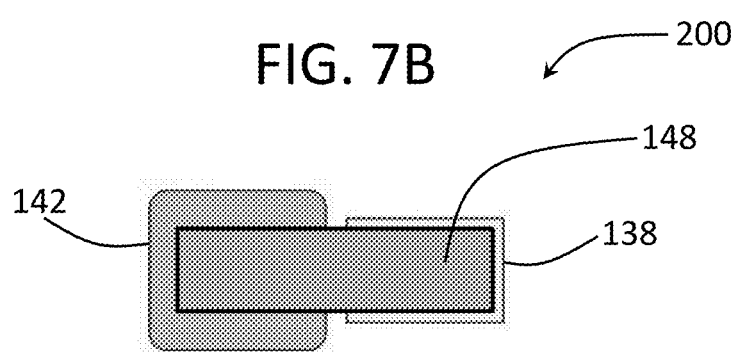
Figure 7C:
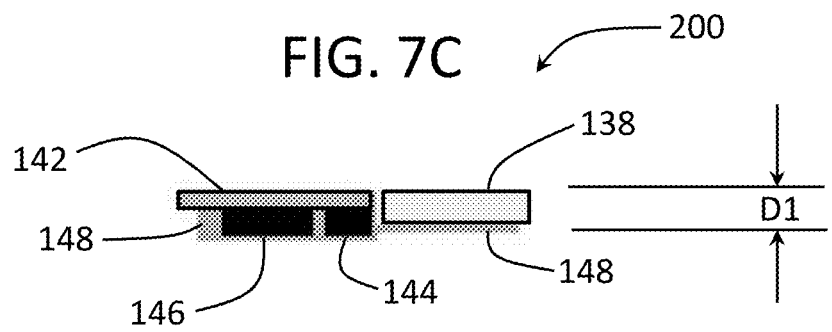

Referring to FIGS. 7A-7C, according to exemplary embodiments hereof, a packaged electronic module 200 (that may correspond to the packaged electronic module 120 in FIG. 1) may be an all-in-one assembly that may generally include a contact plate 142, an electronic readout 138, an integrated circuit (IC) chip 144, a plurality of electronic components 146, and other elements and/or components that may be necessary for the module 200 to perform its desired functionalities as described in this specification or otherwise. FIGS. 7A, 7B and 7C may generally show the top view, bottom view and side view, respectively, of the module 200.

The components 142, 138, 144, 146 (as well as any other components) may be connected together (electrically and/or physically) as required for the module 200 to operate properly. For example, the contact plate 142 may be connected to the IC chip 144, and the IC chip 144 may be connected to the plurality of electronic components 146 and to the electronic readout 138. It is understood that any of the elements 138, 142, 144, 146 may be connected to any other of the elements 138, 142, 144, 146 in any combination. Any types of connections between any of the components may be employed.

In one exemplary embodiment hereof, the packaged electronic module 200 and/or the elements 138, 142, 144, 146 may include other connectors or connecting mechanisms that may be used to connect the module 200 to other components. For example, the module 200 may include a micro-antenna to connect to (and/or communicate with) an internal antenna 110 within the card (best seen in FIG. 1) via inductive coupling. Other types of connectors or connection mechanisms may also be used as required. For example, the module 200 and/or the elements 138, 142, 144, 146 may include electrical and/or physical contacts (connectors) that may be positioned and configured to connect (electrically and/or physically) with other elements that may be configured with the card 100 (e.g., other components configured within the card 100 and/or configured external to the card 100). For example, the module 200 may include other connectors that may be used to connect the module 200 to other components such as an embedded battery. In another example, the module 200 may include connectors that may connect to a value-add component(s), such as a fingerprint sensor, one or more antennas, LEDs, and/or an electronic or mechanical button that may also be included in addition to or instead of the electronic display 138. In this case, the value-add component(s) may include a portion that may be located on the same side, and/or visible on the same side, of the smart card 100 as the contact plate 142 and/or the electronic readout 138.

The module 200 may also include encapsulation 148 materials (e.g., resin) to help secure the components together and to provide protection to the components from moister, corrosion, and other undesirable elements.

In one example, the contact plate 142 and the electronic readout 138 may include portions that may be visible on the same side of the card 100. As shown in FIGS. 7A-7C, these visible components 142, 138 may be configured with portions of their visible sides (e.g. their top surfaces as shown in FIG. 7A) both facing in the same direction (e.g., upward). In this way, with the packaged electronic module 200 configured onto a surface of the smart card 100 (e.g., onto the top surface of the card 100), these portions of the contact plate 142 and of the electronic readout 138 may both be visible on the same surface of the smart card 100. In one preferred implementation, these portions of the top surfaces of the contact plate 142 and of the electronic readout 138 may be visible on the top surface of the smart card 100.

The thickness D1 (shown in FIG. 7C) of the packaged electronic module 200 may preferably be less than the thickness D (shown in FIG. 8) of the smart card 100. In this way, the module 200 may be embedded into the top or bottom surface of the smart card without the module 200 passing all the way through the card 100. Note however that the thickness D1 may be equal to but preferably not greater than the thickness D.

Figure 8:
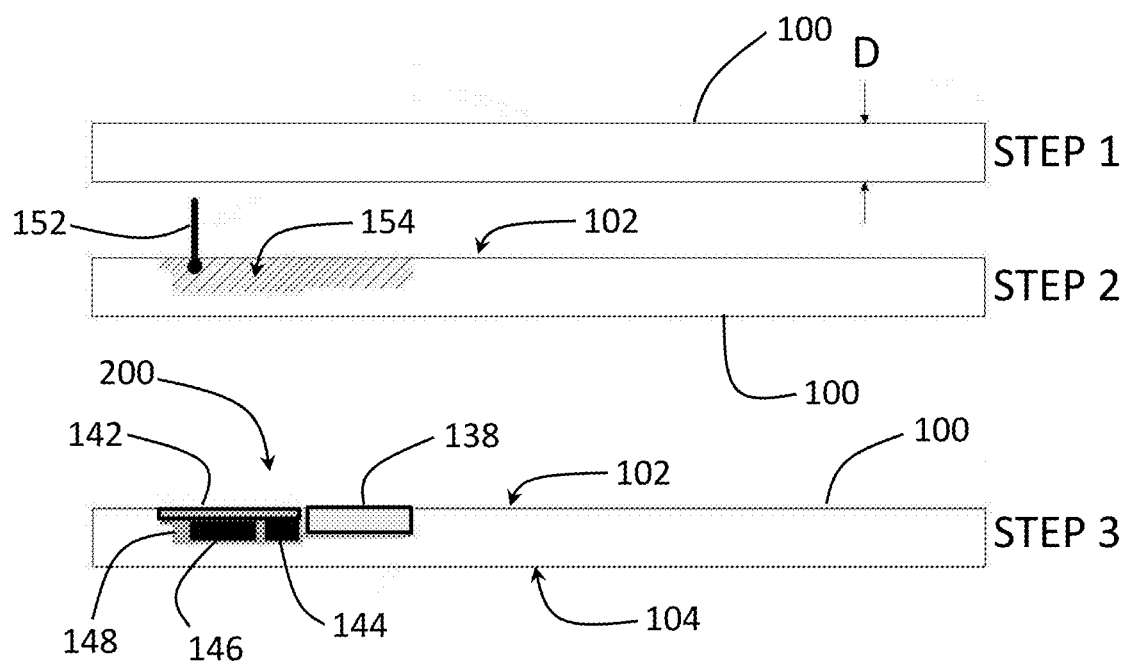
FIG. 8 show aspects of the embedding of the packaged electronic module of FIGS. 7A-7C into a smart card according to exemplary embodiments hereof.

According to an exemplary embodiment hereof, a process and method of fabricating a value-add smart card 100 by embedding the all-in-one packaged electronic module 200 into the smart card 100 is shown in FIG. 8. As shown in STEP 1, a smart card 100 with a thickness of D may be provided. In STEP 2, a surface (e.g., the top surface 102 or "front" of the card 100) of the smart card 100 may be milled using a milling bit 152 or any other mechanism that may remove a portion of the card 100 adequate for the insertion of the module 200. Other techniques such as laser etching or other techniques may also be used. The card may also be formed during its general manufacturing process to include an open area adequate for the embedding of the module 200.

Note that the milled area 154 may extend from the surface of the card 100 (e.g., the top surface 102 or "front" of the card 100) to an intermediary depth within the card 100, but preferably, not all the way through the card 100. The all-in-one assembly 200 with a thickness D1 less than the overall thickness D of the card 100 may be received by the milled area 154 and thereby be embedded into the card 100. In this way, the visible portions of the module 200 (e.g., at least a portion of the top surface of the contact plate 142 and at least a portion of the top surface of the electronic readout 138) may be visible on the top surface 102 of the card 100 when the components 138, 142, may be embedded into the card 100. This is depicted in STEP 3 of FIG. 8.

Note however that if the thickness D1 of the module 200 is equal to the thickness D of the card 100, the milled area 154 may extend from the top surface 102 (front) of the card 100 to the bottom surface 104 (back) of the card 100, and a portion of the module 200 may be visible on the bottom surface 104 of the card 100. However, the portions of the module 200 that are meant to be visible on the top of the card 100 (e.g., at least a portion of the top of the contract plate 142 and at least a portion of the top of the electronic readout 138), may still be so in this scenario. Note that if the card 100 includes a protective overlay on its bottom surface 104, the protective overlay may be left intact or milled through depending on the thickness D1 of the module 200 relative to the thickness D of the card 100.

It may be preferable that the milled area 154 generally correspond to the size, shape and dimensions of the module 200 so that the milled area 154 may receive the module 200 and that the junction between the milled area 154 and the module 200 may be free of gaps, protrusions or disjoints. It may also be preferable that, once embedded, the top surface of the module 200 may be generally flush with the top surface of the card 100. The module 200 may be held within the open area 154 with adhesive, by pressure fit, or by other attachment mechanisms, methods or means.

As described in relation to other exemplary embodiments herein, the footprint of the electronic readout 138 (including or not including the integrated circuit (IC) chip 144 and/or the plurality of electronic components 146) may be generally equal in size, smaller in size, or larger in size than the footprint of the contact plate 142. In previous embodiments, because the visible portions of the contact plate 142 and the electronic readout 138 may be configured on opposite sides of the card 100 (front and back), the footprint size of the electronic display 138 relative to the footprint size of the contact plate 142 may influence the method by which the module 200 may be embedded into the card 100.

However, with the visible portion of the contact plate 138 and the visible portion of the electronic display 138 configured on the same side of the card 100, the footprint size of the electronic readout 138 with respect to the footprint size of the contact plate 142 may not necessarily have the same or similar influence on the method by which the module 200 may be embedded into the card as with the other embodiments.

Figure 9A:
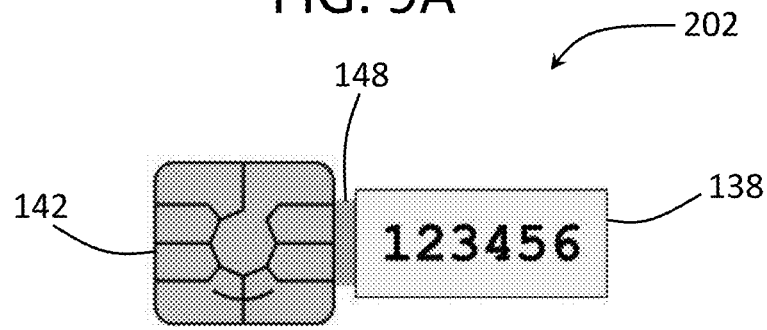
FIGS. 9A-9C show aspects of a packaged electronic module according to exemplary embodiments hereof.
Figure 9B:
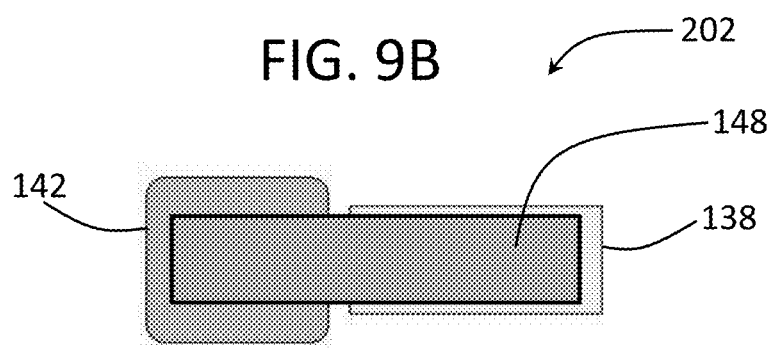
Figure 9C:
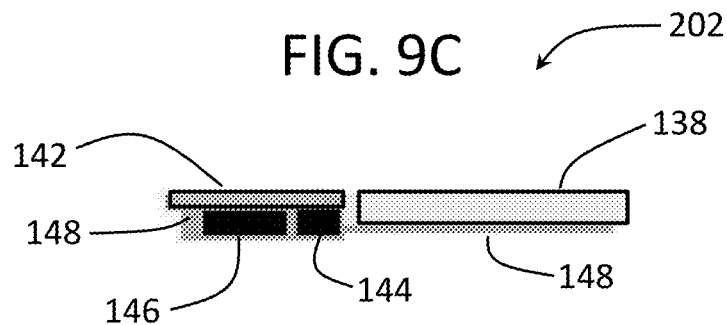
Figure 10:
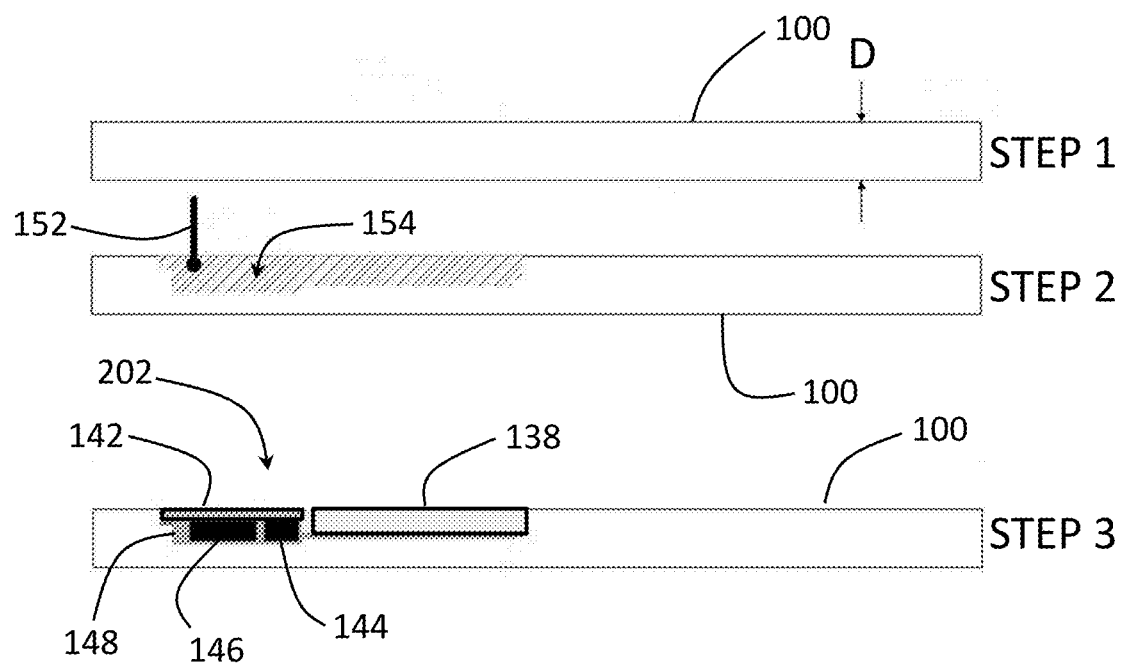
FIG. 10 show aspects of the embedding of the packaged electronic module of FIGS. 9A-9C into a smart card according to exemplary embodiments hereof.

For example, according to exemplary embodiments herein, FIGS. 7A-7C depict a packaged electronic module 200 that may have an electronic readout 138 with a footprint size generally smaller than or equal to the footprint size of the associated contact plate 142. On the other hand, FIGS. 9A, 9B and 9C show the top, bottom and side views, respectively, of the all-in-one packaged electronic module 202 that may include a readout 138 that may have a footprint size larger than the footprint size of the associated contact plate 142. It can be seen however, in FIG. 10, that the process to embed the module 202 into the card 100 may be similar to the process shown and described in relation to FIG. 8, but with a slightly larger milled area 154 that may accommodate the larger electronic readout 138 footprint. All other aspects of this exemplary embodiment of module 202 may be the same or similar to the aspects of the exemplary embodiment of module 200 described in relation to FIGS. 7A-7C and 8.

Figure 11A:
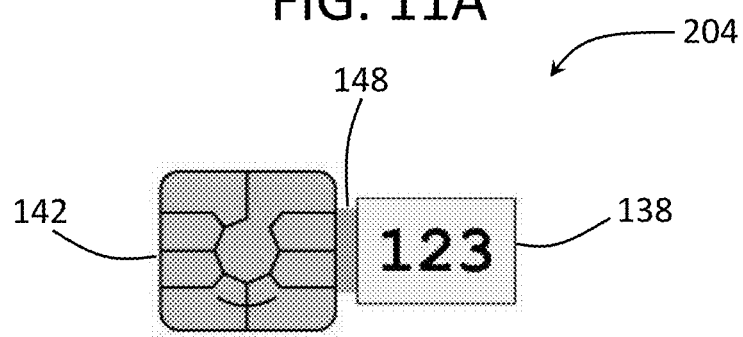
FIGS. 11A-11C show aspects of a packaged electronic module according to exemplary embodiments hereof.
Figure 11B:
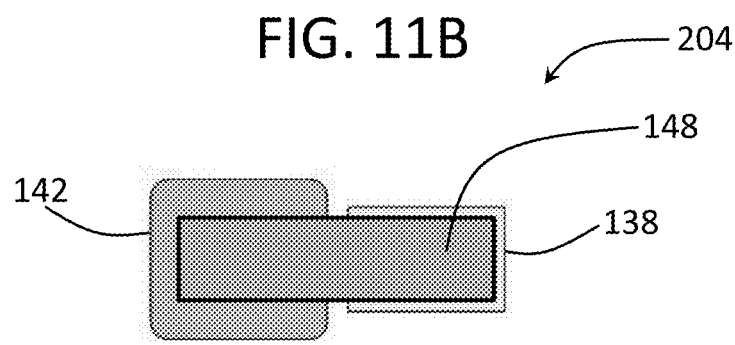
Figure 11C:
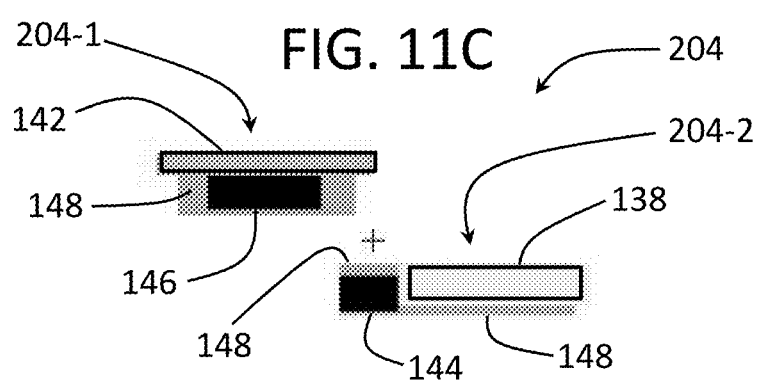
Figure 12:
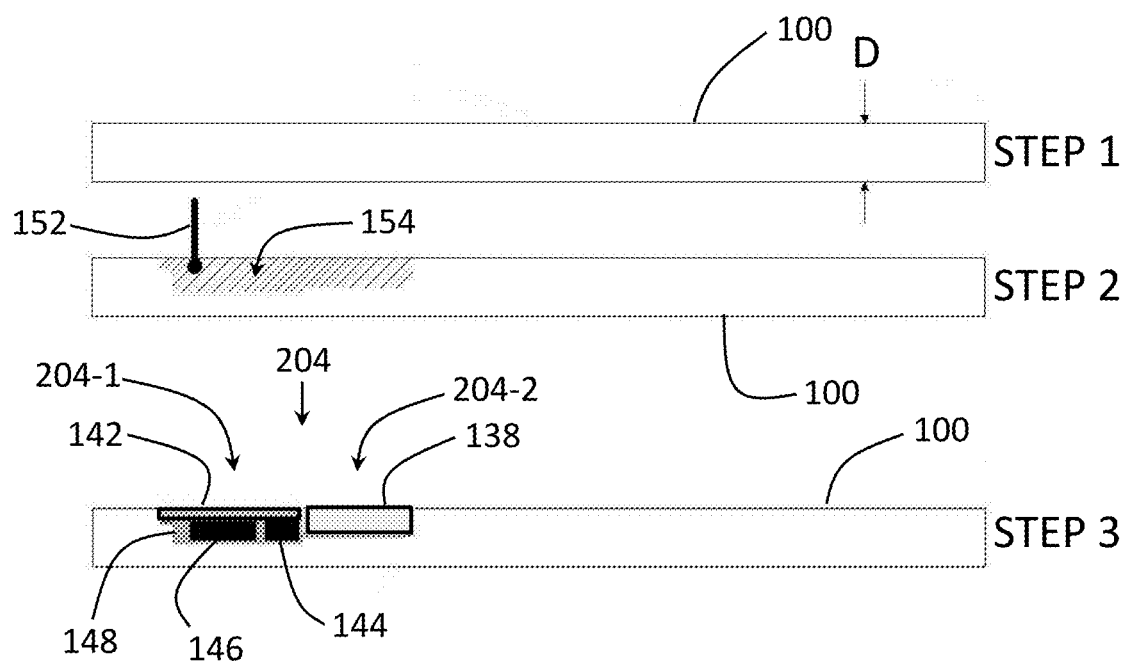
FIG. 12 show aspects of the embedding of the packaged electronic module of FIGS. 11A-11C into a smart card according to exemplary embodiments hereof.

In another exemplary embodiment hereof, an all-in-on electronic packaged assembly 204 may include two or more sub-assemblies that when combined may form the packaged assembly 204. In one example as shown in FIGS. 11A-11C (depicting the top, bottom and side views of the assembly respectively), the module 204 may include a first sub-assembly 204-1 and a second sub-assembly 204-2 (best seen in FIG. 11C). In this example, the first sub-assembly 204-1 may generally include a contact plate 142 and electronic components 146, and the second sub-assembly 204-2 may generally include an electronic readout 138 and an IC 144. Note however, that each and/or either of the first and second sub-assemblies 204-1, 204-2 may include any of the elements 138, 142, 144, 146 or any other elements as required by the module 200. As shown, the footprint size of the electronic readout 138 of the module 204 may be equal to or smaller than the footprint size of the associated contact plate 142 so that when the sub-assemblies are combined the resulting module 204 may resemble the module 200 of FIGS. 7A-7C and 8. All aspects of module 200 as described above with relation to FIGS. 7A-7C and 8 may also apply to the combined module 204.

The packaged module 204 may be configured with the card 100 in a similar manner as described above with relation to module 200 in FIG. 8, however, with the added step(s) of combining the sub-assemblies 204-1 and 204-2 together to form the assembly 204.

The sub-assemblies 204-1, 204-2 may be combined prior to or during the configuration of the module 204 with the card 100. In one example, the sub-module 204-1 may be placed in its respective position within the milled area 154 of FIG. 12 first, and the sub-module 204-2 may be placed in its respective position within the milled area 154 second (shown in STEP 3). Note that the order of insertion may be reversed or performed in any order. For example, that the sub-assembly 204-2 may be embedded into the card 100 first and the sub-assembly 204-1 may be embedded into the card 100 second.

In one exemplary embodiment hereof, the sub-assemblies 204-1, 204-2 may each include corresponding electrical and/or physical contacts or other connection mechanisms configured to mate with one another respectively. That is, the sub-assembly 204-1 may include connection mechanisms and the sub-assembly 204-2 may include connection mechanisms, and the connection mechanisms of 204-1 and the connection mechanisms of 204-2 may be configured to connect with one another respectively. In this way, when the sub-assemblies 204-1, 204-2 are embedded into the open area 154 of the card 100 (together, separately, one-by-one or in any combination), their corresponding electrical and/or physical contacts may contact one another to properly connect (both electrically and physically) the sub-assemblies 204-1, 204-2 together. This may result in the combined assembly 204 that may thereby function properly. It is understood that the electrical and/or physical connections between the sub-assemblies 204-1, 204-2 may be configured and may make contact within the card 100 (e.g., within the open area 154), outside the card 100 (e.g., on the top or bottom surface(s) of the card 100) and in any combination thereof.

The example described above is meant for demonstrational purposes, and a person of ordinary skill in the art will understand, upon reading this specification, that the all-in-one assembly 204 may comprise any number of sub-assemblies 204-$n$, where n is any number, and that the sub-assemblies 204-1, 204-2, 204-$n$ may be configured within the open area 154 of the card 100 in any order and/or in any position with respect to one another. In addition, not all of the sub-assemblies 204-$n$ may be visible from the surface of the card 100 and some of the sub-assemblies 204-$n$ may reside in inner layers of the card 100. However, it may be preferable that the sub-assemblies 204-$n$ that may include the contact plate 142 and the electronic readout 138 may reside in areas of the open area 154 such that the desired visible portions of the contact plate 142 and the desired visible portions of the electronic display 138 may be visible from the same surface of the card 100.

The sub-assemblies 204-1, 204-2, 204-*n* may also be combined prior to the embedding of the combined module 204 into the card 100. In addition, some of the sub-assemblies 204-*n* may be combined prior to being embedded into the card 100, and other sub-assemblies 204-*n* may be combined during the embedding of the sub-assemblies 204-*n* into the card 100. It is clear that any combination of sub-assemblies 204-*n* may be combined prior to or during the embedding of the sub-assemblies 204-*n* into the card 100, and in any combination thereof. It is also understood that any and/or all of the sub-assemblies 204-*n* may include corresponding electrical and/or physical contacts that may be configured to make electrical and/or physical contact with the corresponding contacts on any other sub-assembly 204-*n* during the embedding of the sub-assemblies 204-*n* into the card 100 as required by the smart card 100 and/or the module 200.

Figure 13A:
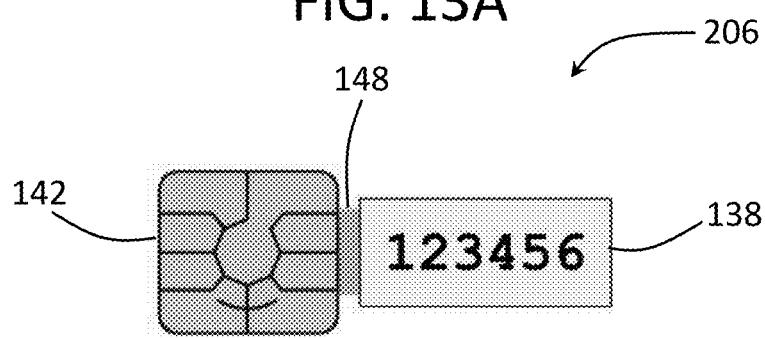
FIGS. 13A-13C show aspects of a packaged electronic module according to exemplary embodiments hereof.
Figure 13B:
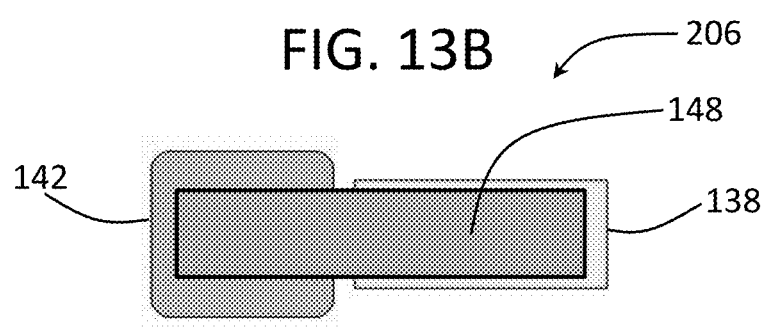
Figure 13C:
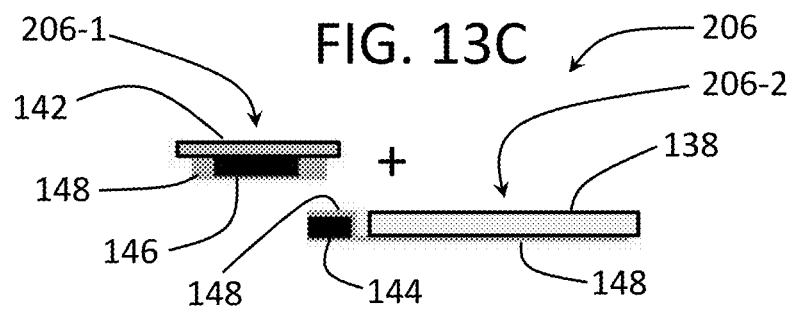

While FIGS. 11A-11C and 12 depict an all-in-one assembly 204 formed of sub-assemblies 204-1, 204-2 that when combined may have an electronic readout 138 with a footprint size that may be the same size or smaller than the footprint of the associated contact plate 142, FIGS. 13A, 13B and 13C show the top, bottom and side views, respectively, of a packaged electronic module 206 formed of sub-assemblies 206-1 and 206-2 that when combined may have an electronic readout 138 with a footprint size that may be larger than the footprint size of its associated contact plate 142.

Figure 14:
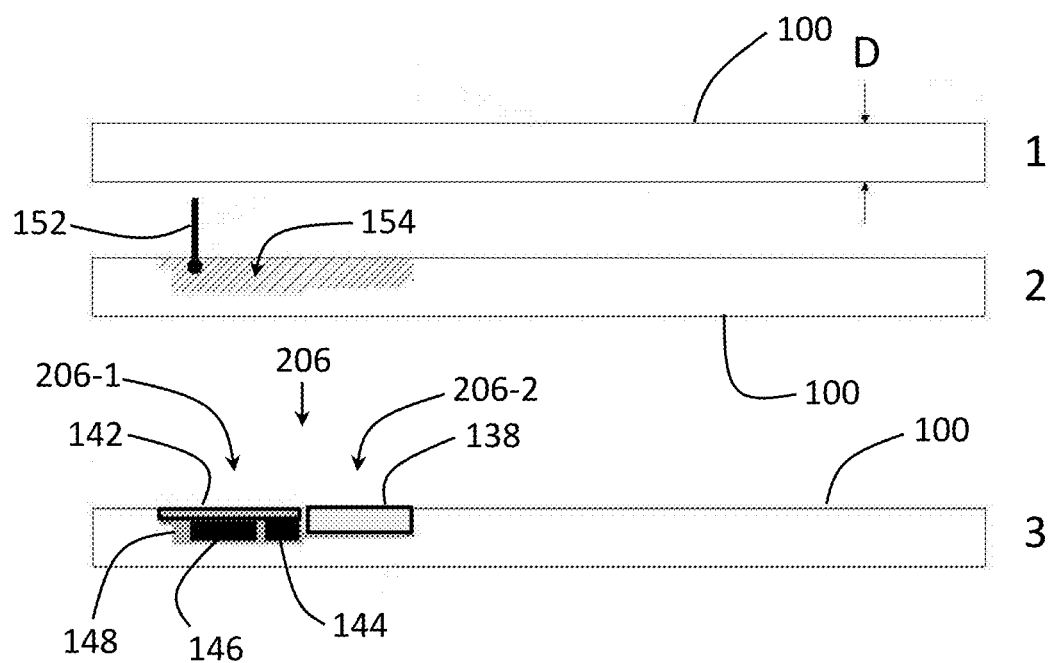
FIG. 14 show aspects of the embedding of the packaged electronic module of FIGS. 13A-13C into a smart card according to exemplary embodiments hereof.

It is understood that all aspects of module 204 described above also apply to the module 206, but that the process of embedding the module 206 into the card 100 may require a larger open area 154 to accommodate the larger footprint size of the electronic readout. This is shown in FIG. 14.

It is understood by a person of ordinary skill in the art, upon reading this specification, that in any of the embodiments described above with relation to FIGS. 7A-7C, 8, 9A-9C, 10, 11A-11C, 12, 13A-13C and 14, that at least a portion of the electronic readout 138 may be positioned and/or visible in any position on the same surface of the card with respect to at least a portion of the contact plate 142. That is, while the FIGS. 7A-7C, 8, 9A-9C, 10, 11A-11C, 12, 13A-13C and 14 may generally depict the electronic readout 138 as positioned next to or generally adjacent to the contact plate 142, the electronic readout 138 may be positioned in any position with respect to the contact plate 142 such as to the right of the contact plate 142, to the left, above, below, diagonal in any direction, offset by any distance in any direction, or otherwise in any position on the same side of the card 100 as the contact plate 142 so that the electronic readout 138 and the module 200, 202, 204, 206 and all of the components associated therewith may each perform their desired functionalities.

It is also appreciated that for all of the embodiments herein, the contact plate 142 and the electronic readout 138 may also be generally configured and generally visible on opposite sides of the card 100. For example, the contact plate 142 may be generally configured and visible on the top surface (front) of the card 100, and the electronic display 138 may be generally configured and visible on the bottom side (back) of the card 100, or vice versa. It is also appreciated that the contact plate 142 and the electronic readout, when generally configured and visible on opposite sides of the card 100, may be in any orientation and/or location with respect to one another. For example, a portion or all of the electronic readout 138 may be generally beneath the contact plate 142 (but located on the opposite side of the card 100), or a portion or all of the electronic display 138 may be laterally offset from the contact plate 142 (but located on the opposite side of the card 100) in any lateral position with respect to the contact plate 142. The IC chip 144 and/or the electronic components 146 may be located anywhere that may allow for the components 144, 146 to make adequate electrical connection with the contact plate 142 and/or the electronic display 138 and/or each other as required to fulfill their respective functionalities. It may also be preferable that an electrical connection may be made between the contact plate 142 and/or the electronic display 138 and/or the IC chip 144 and/or the electronic components 146 and between any combination thereof as required for the various components individually and in combination to fulfill their respective and combined functionalities. It is also understood that these electrical connections may be configured prior to or during the embedding of any of the components 138, 142, 144, 146 into the card 100. It can be seen in this embodiment that the contact plate 142 may be embedded into the card 100 on one surface of the card 100 (e.g. the front or top of the card 100) and the electronic readout 138 may be embedded into the card 100 on the surface of the card that may be opposite the surface that may include the contact plate 142.

In all of the embodiments described herein or otherwise, the integrated circuit chip 144 may include a microprocessor, a microcontroller, a CPU, memory as well as any other components and elements to perform its functionalities. In all of the embodiments described herein, the plurality of electronic components may include resistors, capacitors, inductors, matching networks as well as any other components and elements necessary for the modules 120, 140, 160, 170, 180, 190, 200, 202, 204, 206 to perform their desired functionalities.

Figure 15A:
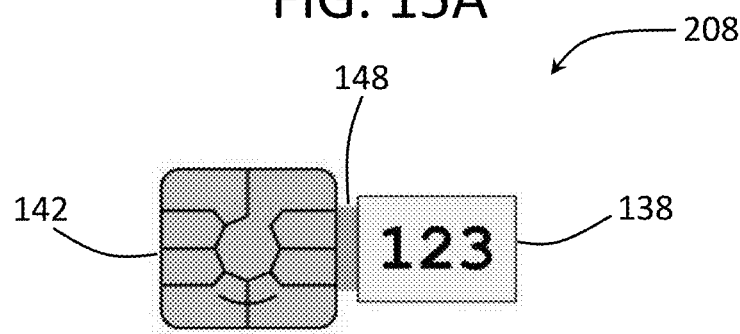
FIGS. 15A-15C show aspects of a packaged electronic module according to exemplary embodiments hereof.
Figure 15B:
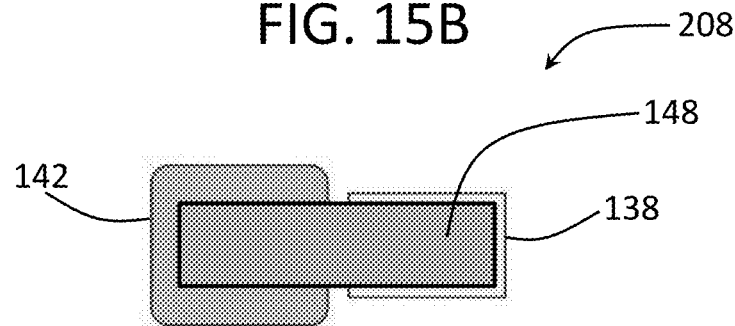
Figure 15C:
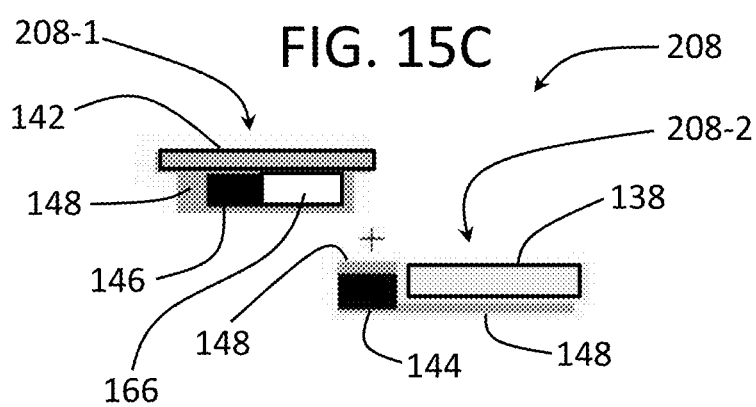

In all of the embodiments described herein or otherwise, the modules 120, 140, 160, 170, 180, 190, 200, 202, 204, 206 and/or any sub-assemblies thereof (e.g., sub-assemblies 204-1, 204-2, 204-*n*) may include elements other than or in addition to the described elements. For example, in one exemplary embodiment hereof as shown in FIGS. 15A, 15B and 15C, in addition to the contact plate 142, the electronic readout 138, the electronic components 146 and/or the IC 144, the module 208 and/or any sub-assemblies (e.g., sub-assemblies 208-1, 208-2, 208-*n*) may include one or more antennas 166. In one exemplary embodiment hereof, the one or more antennas 166 may be configured with the sub-assembly 208-1 as shown, and/or with the sub-assembly 208-2, with both sub-assemblies 208-1, 208-2, and any combination thereof. In one exemplary embodiment hereof, the sub-assemblies 208-1, 208-2 may be configured within the card 100 using the methodology as described in relation to the embodiment of FIG. 12 or as with any other embodiment described herein. While FIG. 15C shows one antenna 166 configured with the sub-assembly 208-1, any number of antennas 166 may be configured with any sub-assembly 208-*n* or any combinations of sub-assemblies 208-*n*. It is also understood that if the module 208 may not include sub-assemblies 204-*n* (e.g., similar to module 200), that the one or more antennas 166 may be configured with the module 208 in any way. In this case, the module 208 may be configured within the card 100 as described in relation to the embodiment of FIG. 8 or as with any other embodiment described herein. It is also understood that the one or more antennas 166 may be configured with any modules 200, 202, 204, 206, 208 in any way as required.

In addition, it is understood by a person of ordinary skill in the art, upon reading this specification, that the various aspects of the embodiments described herein may be combined in any way and in any combination. For example, one exemplary embodiment may include an all-in-one module that may include a visible portion of a contact plate 142 and a visible portion of an electronic readout 138 on the top surface of the smart card 100, and in addition, a visible portion of an additional electronic readout visible 138 on the bottom surface of the smart card 100. Another exemplary embodiment may include an all-in-one module that may include a visible portion of a contact plate 142 on the top of the smart card 100, and a visible portion of one or more electronic readouts on either the same surface as the contact plate 142, on different surfaces as the contact plate 142, or in any combination of surfaces as the contact plate 142. In this embodiment, the electronic readout(s) may be located on the surfaces in any position and location with respect to the contact plate 142. In another example, another exemplary embodiment may include the IC chip 146 positioned generally beneath, below or behind the contact plate 142, and the electronic components 146 positioned generally beneath, below or behind the electronic display 138. In another exemplary embodiment, the IC chip 146 and the electronic components 146 may be positioned generally beneath, below or behind the electronic display 138. In another exemplary embodiment, the IC chip 146 may be positioned generally beneath, below, or below the electronic display 138, and the electronic components 146 may be positioned generally beneath, below or behind the contact plate 142. In addition, any portion of the IC chip 146 and/or any portion of the electronic components 146 may be positioned beneath the contact plate 142 and/or the electronic readout 138, or any combination thereof. Any and all combinations of any or all of the aspects of any or all of the exemplary embodiments described herein are all contemplated by this specification.

As will be appreciated by one skilled in the art, a software embodiment may include firmware, resident software, micro-code, etc. Certain components including software or hardware or combining software and hardware aspects may generally be referred to herein as a "circuit," "module" or "system." Furthermore, the subject matter disclosed may be implemented as a computer program product embodied in one or more computer readable storage medium(s) having computer readable program code embodied thereon. Any combination of one or more computer readable storage medium(s) may be utilized. The computer readable storage medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing.

In the context of this document, a computer readable storage medium may be any tangible medium that may contain, or store a program for use by or in connection with an instruction execution system, apparatus, or device. A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that may communicate, propagate, or transport a program for use by or in connection with an instruction execution system, apparatus, or device.

Program code embodied on a computer readable storage medium may be transmitted using any appropriate medium, including but not limited to wireless, wire line, optical fiber cable, RF, etc., or any suitable combination of the foregoing. Computer program code for carrying out the disclosed operations may be written in any combination of one or more programming languages, including an object oriented programming language such as Java, Smalltalk, C++ or the like and conventional procedural programming languages, such as the "C" programming language or similar programming languages.

The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

As used herein, including in the claims, the phrase "at least some" means "one or more," and includes the case of only one. Thus, e.g., the phrase "at least some ABCs" means "one or more ABCs," and includes the case of only one ABC.

As used in this description, the term "portion" means some or all. So, for example, "A portion of X" may include some of "X" or all of "X". In the context of a conversation, the term "portion" means some or all of the conversation.

As used herein, including in the claims, the phrase "based on" means "based in part on" or "based, at least in part, on," and is not exclusive. Thus, e.g., the phrase "based on factor X" means "based in part on factor X" or "based, at least in part, on factor X." Unless specifically stated by use of the word "only", the phrase "based on X" does not mean "based only on X."

As used herein, including in the claims, the phrase "using" means "using at least," and is not exclusive. Thus, e.g., the phrase "using X" means "using at least X." Unless specifically stated by use of the word "only", the phrase "using X" does not mean "using only X."

In general, as used herein, including in the claims, unless the word "only" is specifically used in a phrase, it should not be read into that phrase.

As used herein, including in the claims, the phrase "distinct" means "at least partially distinct." Unless specifically stated, distinct does not mean fully distinct. Thus, e.g., the phrase, "X is distinct from Y" means that "X is at least partially distinct from Y," and does not mean that "X is fully distinct from Y." Thus, as used herein, including in the claims, the phrase "X is distinct from Y" means that X differs from Y in at least some way.

It should be appreciated that the words "first" and "second" in the description and claims are used to distinguish or identify, and not to show a serial or numerical limitation. Similarly, the use of letter or numerical labels (such as "(a)", "(b)", and the like) are used to help distinguish and/or identify, and not to show any serial or numerical limitation or ordering.

While the invention has been described in connection with what is presently considered to be the most practical and preferred embodiments, it is to be understood that the invention is not to be limited to the disclosed embodiment, but on the contrary, is intended to cover various modifications and equivalent arrangements included within the spirit and scope of the appended claims.

Although certain presently preferred embodiments of the invention have been described herein, it will be apparent to those skilled in the art to which the invention pertains that variations and modifications of the described embodiments may be made without departing from the spirit and scope of the invention.

The foregoing description of the preferred embodiment of the present invention has been presented for the purpose of illustration and description. It is not intended to be exhaustive or to limit the invention to the precise form disclosed. Many modifications and variations are possible in light of the above teachings. It is intended that the scope of the present invention not be limited by this detailed description, but by the claims and the equivalents to the claims appended hereto.

What is claimed is:

1. An electronic module for use with a card, comprising:
   at least one integrated circuit chip;
   a contact plate configured with the at least one integrated circuit chip;
   a plurality of electronic components connected to the at least one integrated circuit chip; and
   at least one electronic display connected to the plurality of electronics components and/or the at least one integrated circuit chip;
   wherein the electronic module is configured with the card, and at least a portion of the contact plate and at least a portion of the at least one electronic display are visible on a first surface of the card; and
   wherein a first portion of the electronic module is embedded into the first surface of the card from the front of the first surface, and a second portion of the electronic module is embedded into the first surface of the card separately from the first portion and from the front of the first surface, and the portions are connected to form a value-add smart card.

2. The electronic module of claim 1 wherein the first surface of the card is the front of the card or the back of the card.

3. The electronic module of claim 1 further comprising at least one antenna configured with the integrated circuit chip.

4. The electronic module of claim 1 further comprising electrical connectors configured to connect with other electrical components within the card.

5. The electronic module of claim 1 wherein the packaged electronic module is connected to one or more card antennas within the card.

6. The electronic module of claim 1 wherein the packaged electronic module is connected to an embedded battery within the card.

7. The electronic module of claim 1, wherein the electronic display or the contact plate of a packaged electronic module is replaced by at least one value-add component selected from the group: a fingerprint sensor, LEDs, an electronic button and a mechanical button.

8. An electronic module for use with a card, comprising:
   at least one integrated circuit chip;
   a plurality of electronic components connected to the at least one integrated circuit chip; and
   at least one electronic display connected to the plurality of electronics components and/or the at least one integrated circuit chip;
   wherein a first portion of the electronic module is embedded into a first surface of the card from the front of the first surface, and a second portion of the electronic module is embedded into the first surface of the card separately from the first portion and from the front of the first surface, and the portions are connected to form a value-add smart card.

9. The electronic module of claim 8 further comprising a contact plate configured with the at least one integrated circuit chip.

10. The electronic module of claim 9 wherein the contact plate is embedded into the first surface of the card from the front of the first surface.

11. The electronic module of claim 8 wherein the first surface of the card is the front of the card or the back of the card.

12. The electronic module of claim 8 further comprising at least one antenna configured with the integrated circuit chip.

13. The electronic module of claim 8 further comprising electrical connectors configured to connect with other electrical components within the card.

14. A method of assembling an electronic module within a card, the method comprising:
    (A) providing a card;
    (B) creating an open area in a first surface of the card;
    (C) embedding a first portion of the electronic module into a first portion of the open area; and
    (D) embedding a second portion of the electronic module into a second portion of the open area;
    wherein the first portion of the electronic module and the second portion of the electronic module are electrically connected together by the embedding of the first portion of the electronic module and the second portion of the electronic module into the open area.

15. The method of claim 14 wherein the first portion of the electronic module includes a contact plate and the second portion of the electronic module includes an electronic display.

16. The method of claim 14 wherein the first surface is the front of the card or the back of the card.

17. The method of claim 14 wherein the first portion of the electronic module and/or the second portion of the electronic module includes an antenna.

* * * * *